United States Patent [19]
Saito et al.

[11] Patent Number: 5,879,217
[45] Date of Patent: Mar. 9, 1999

[54] CATHODE RAY TUBE AND METHOD OF MANUFACTURING THE SAME

[75] Inventors: Tsunenari Saito, Tokyo; Shiro Kenmotsu; Takuji Inoue, both of Saitama, all of Japan

[73] Assignee: Sony Corporation, Tokyo, Japan

[21] Appl. No.: 600,741

[22] Filed: Feb. 13, 1996

[30] Foreign Application Priority Data

Feb. 14, 1995 [JP] Japan ................................. 7-025064

[51] Int. Cl.⁶ .......................... H01J 29/88; H01J 29/89
[52] U.S. Cl. ........................... 445/23; 445/8; 348/834; 348/824
[58] Field of Search ..................... 445/8, 23; 348/824, 348/834, 835; 228/111.5

[56] References Cited

U.S. PATENT DOCUMENTS

| | | | |
|---|---|---|---|
| 4,841,372 | 6/1989 | Lee | 445/8 |
| 4,910,090 | 3/1990 | Kuhlman et al. | 348/834 |
| 4,937,493 | 6/1990 | Koike et al. | 348/824 |
| 5,299,726 | 4/1994 | Sauer | 228/111.5 |
| 5,578,657 | 11/1996 | Inoue et al. | 522/92 |
| 5,653,837 | 8/1997 | Tabuki et al. | 156/99 |

*Primary Examiner*—Kenneth J. Ramsey
*Attorney, Agent, or Firm*—Hill & Simpson

[57] ABSTRACT

A cathode ray tube, comprising a front panel glass having a fluorescent screen; a glass envelope sealed with the front panel; a film having a conductive layer and an insulating layer superposed on the outer side of the front panel glass; a plurality of ground electrodes soldered on the film by using a soldering iron which has an ultrasonic wave generator; and a conductive layer connected with the ground electrodes electrically through the insulating layer, and a method for manufacture of the same.

6 Claims, 4 Drawing Sheets

CATHODE RAY TUBE AND METHOD OF MANUFACTURING THE SAME

BACKGROUND OF THE INVENTION

1. Field of the Invention

The present invention relates to a cathode ray tube and a method of manufacturing the same.

2. Description of the Related Art

The panel of a cathode ray tube is produced by molding molten glass. During the molding process, the surface of the panel becomes rough, so it is necessary to polish the surface of the panel before supplying it for use. In the process of production of a cathode ray tube, this polishing step accounts for 20 to 30 percent of the time and cost involved in making the panel. Therefore, rationalization of this polishing step is necessary in order to meet with demands for reductions in the cost of manufacturing cathode ray tubes.

The increasing size of cathode ray tubes and the increasing flatness of their panels have in addition been accompanied with thicker designs of their panels in order to secure their requisite anti-implosion performance. When panels are made thicker, however, their weight undesirably increases.

In view of this situation, there have been proposed the method of adhering functional glass to the surface of the panel by an adhesive (polypropylen glycol PPG laminate method) and the method of adhering a transparent functional film to the surface of the panel by an adhesive so that there are not that great demands on the precision of polishing of the panel surface and further the thickness can be kept thin.

In the former PPG laminate method, the final polishing of the panel is eliminated, but taping and other complicated steps are involved. The latter method is therefore considered more promising.

In both methods, however, there are problems with preventing charges from forming at the panel surface.

The following two methods are known for preventing charges. Each has its own problems, however.

The first method calls for spraying the face of the panel with an alcohol solution of silicon alkoxide in which has been dispersed a conductive filler such as indium tin oxide and tin antimony oxide, baking this at a relative high temperature (150° to 200° C.), and thereby forming a conductive layer on the surface of the panel. The conductive layer formed by this method is extremely difficult to salvage after baking when a defect is found in the coating. Further, when touched by the hand, it picks up fingerprints or other dirt and therefore causes a deterioration in the quality of the reproduced image. This dirt is also hard to remove by wiping with a dry or wet cloth etc.

The second method calls for adhering by an adhesive to the outer surface of the panel of a cathode ray tube a panel comprised of a sheet of glass molded to the radius of curvature of the outside of the panel and formed on its surface with an anti-reflection film comprised of a transparent conductive layer made of indium tin oxide etc. and multilayer optical thin film comprised of titanium dioxide, silicon dioxide, etc. This method is now being used for some cathode ray tubes, but has problems in terms of suitability for mass production and further increases the manufacturing costs.

Further, it has been considered to include the transparent conductive layer in the functional film adhered to the surface of the panel. Effective and simple means for grounding this conductive layer have been sought.

SUMMARY OF THE INVENTION

The present invention was made in consideration of this situation and has as its object the provision of a cathode ray tube of the type with a functional film adhered to the panel surface whereby an effective, simple means for preventing charge-up at the panel can be realized and a method of manufacturing the same.

According to a first aspect of the invention, there is provided a cathode ray tube including a front panel glass having a fluorescent screen; a glass envelope sealed with the front panel; a film having a conductive layer and an insulating layer superposed on the outer side of the front panel glass; a plurality of ground electrodes soldered on the film by using a soldering iron which has an ultrasonic wave generator; and the conductive layer is preferably connected with the ground electrodes electrically through the insulating layer.

Preferably, the film comprises an anti-pollution layer formed between the ground electrodes and the conductive layer.

Preferably, there are further provided a plurality of conductive tapes arranged at the ground electrodes.

According to a second aspect of the invention, there is provided a method of manufacturing a cathode ray tube having a front panel glass coated with a film, including cleaning the front panel glass; providing an ultraviolet-curing resin composition on the front panel; arranging a film having a conductive layer and an insulating layer on the ultraviolet-curing resin composition; curing the ultraviolet-curing resin composition by irradiation with ultraviolet rays to join the front panel glass and the film into one unit; and soldering a plurality of ground electrodes on the film by using a soldering iron which has an ultrasonic wave generator.

Preferably, the ultraviolet-curing resin composition has a refractive index which differs from the refractive index of the front panel glass by not more than 0.8 percent.

Preferably, the film comprises an anti-pollution layer formed between the ground electrodes and the conductive layer.

Preferably, the surface of the film is cleaned by irradiation with ultraviolet rays.

BRIEF DESCRIPTION OF THE DRAWINGS

These and other objects and features of the present invention will become more apparent from the following description of the preferred embodiments made with reference to the attached drawings, in which.

DESCRIPTION OF THE PREFERRED EMBODIMENTS

Functional films such as anti-reflection films are sometimes adhered to the outsides of cathode ray tubes, display devices having cathode ray tubes, and other display devices for the purpose of softening the glare of the outside light at the surface of the panel where the image is displayed so as to enable reproduction of a desirable image or character information. Also, the outermost surfaces of functional films are sometimes covered by an anti-pollution layer for keeping the surface free of fingerprints etc. These anti-reflection films and anti-pollution layers are generally insulating in nature.

From the viewpoint of preventing charge-up at the panel surface, further, it is desirable to include a conductive layer in the functional film. Further, to exhibit the best anti-reflection effect by the anti-reflection film, the anti-reflection film should preferably be positioned in the functional film toward the outside from this conductive layer.

When a functional film having an anti-reflection film or other insulating layer positioned at the outside of the conductive layer in this way is adhered to the surface of the panel, a problem arises with the grounding of the conductive layer. To ground the conductive layer, it has been considered to remove parts of the anti-reflection film or other insulating layer and then attach conductive tape at those portions to establish conduction with the conductive layer. This method, however, requires delicate work such as removal of parts of the insulating layer, so is not practical.

The present inventors engaged in studies on techniques for preventing charge-up at the surface of panels by an effective and simple means for cathode ray tubes having panels with functional films on them and as a result discovered that ground electrodes formed by ultrasonic solder by ultrasonic soldering from above the anti-reflection film or other insulating layer enabled the establishment of conduction with the conductive layer from above the insulating layer.

Below, a detailed description will be made of the cathode ray tube and method of manufacturing the same according to the present invention with reference to the drawings.

Figure 1:
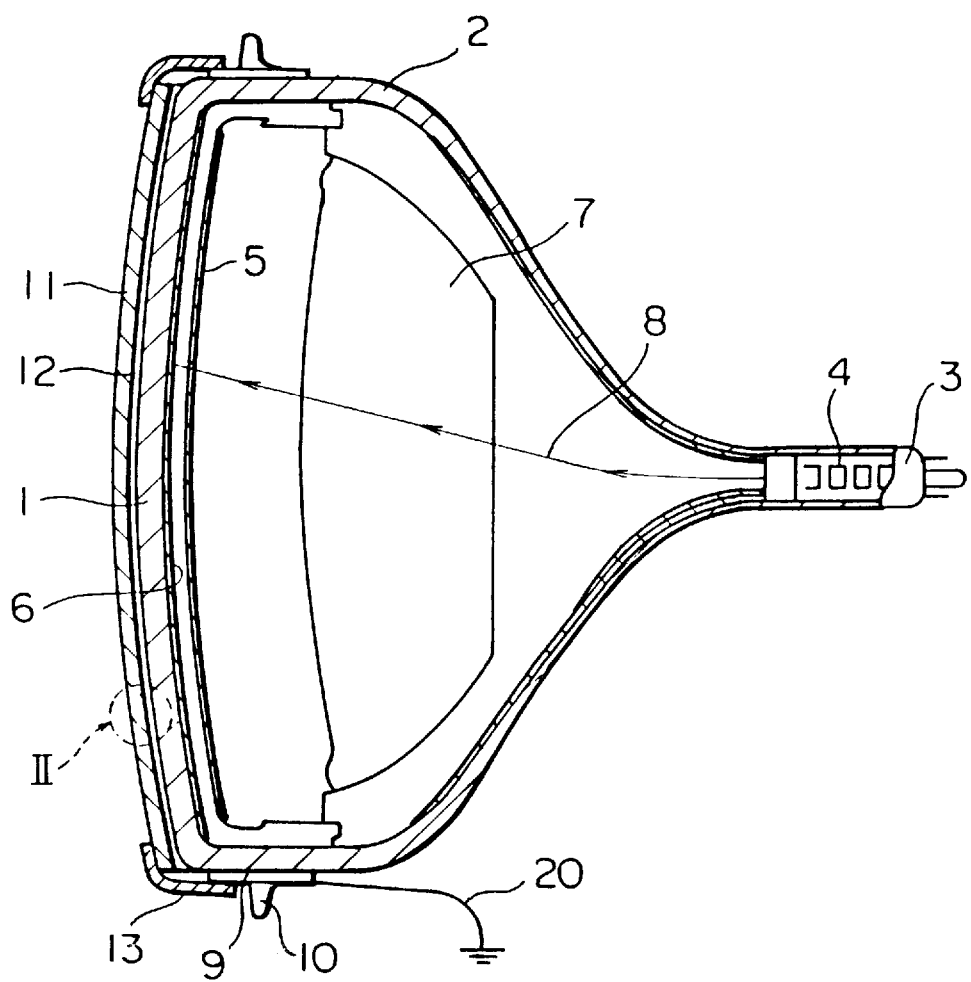
FIG. 1 is a schematic cross-sectional view of a cathode ray tube according to a first embodiment of the present invention.

FIG. 1 is a schematic cross-sectional view of a cathode ray tube according to a first embodiment of the present invention.

The color cathode ray tube according to an embodiment of the present invention is comprised of a vacuum container formed by a panel 1, a funnel section 2, and a neck tube 3. The panel 1 and the funnel section 2 are joined by frit glass. On the outer circumference of the panel 1 is wound a tension band 9 for implosion protection. At the outer circumference of the tension band 9 is formed a mounting flange 10. The cathode ray tube is attached inside the television or other display device through this mounting flange 10. The tension band 9 or mounting flange 10 is formed by a metal or other conductive substance and is grounded through a ground wire 20.

At the inside surface of the panel 1 is found a fluorescent screen 6 on which are coated blue, green, and red emitting phosphors. A shadow mask 5 is arranged near the fluorescent screen 6. The shadow mask 5 is held by a mask holding frame. A magnetic shield 7 is attached at the electron gun side.

The electron beam 8 from the electron gun 4 housed in the neck tube 3 passes through the shadow mask 5, reaches the fluorescent screen 6 formed at the inside surface of the panel, and excites predetermined phosphors to cause them to emit light.

Figure 2:
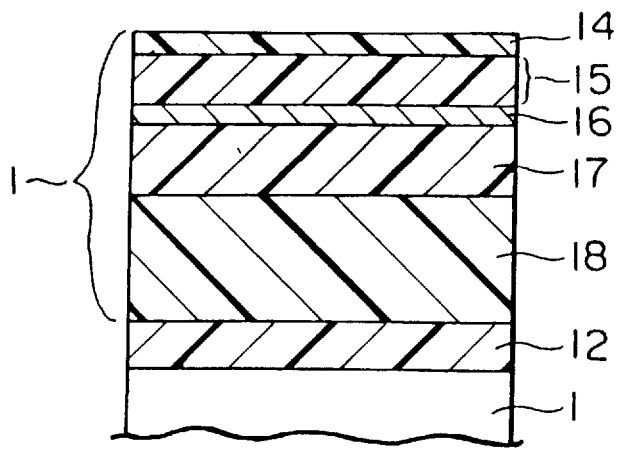
FIG. 2 is an enlarged cross-sectional view of key portions in a part II shown in FIG. 1.

FIG. 2 is an enlarged cross-sectional view of key portions in part II shown in FIG. 1.

At the surface of the panel 1, as shown in detail in FIG. 2, a functional film 11 is attached by an ultraviolet curing resin composition 12.

The functional film 11, as shown in FIG. 2, is comprised of a transparent plastic film substrate 18, a hard coat film 17, a conductive layer 16, an anti-reflection film 15, and an anti-pollution layer 14. The transparent plastic film substrate 18 may be made of polyethylene terephthalate (PET), polycarbonate (PC), polymethylacrylate (PMMA), styrene-methylmethacrylate (MS), polystyrene (PS), etc. The thickness of the substrate 18 is not particularly limited, but for example is preferably 50 to 250 $\mu$m.

On the transparent plastic film substrate 18 is formed a hard coat film 17 comprised of a thin film (3 to 10 $\mu$m) of an acrylic ultraviolet curing resin for the purpose of strengthening the surface hardness and wear resistance of the functional film 11. On top of this is formed a transparent conductive layer 16 comprised of an indium tin oxide layer (15 nm to 150 nm) formed by the vapor deposition or sputter method.

An anti-reflection film 15 for softening the glare of outside light and reproducing better pictures and character information is comprised of a multilayer optical thin film. The anti-reflection effect of the multilayer optical thin film is obtained by alternately laminating thin film materials with different refractive indexes.

Low refractive index materials include magnesium fluoride ($MgF_2$), silicon dioxide ($SiO_2$), etc., while high refractive index materials include titanium dioxide ($TiO_2$), titanium oxide ($Ta_2O_5$), zirconium dioxide ($ZrO_2$), etc. The thickness of the anti-reflection film 15 is not particularly limited, but in the case of four layers is preferably 210 to 260 nm.

Figure 3:
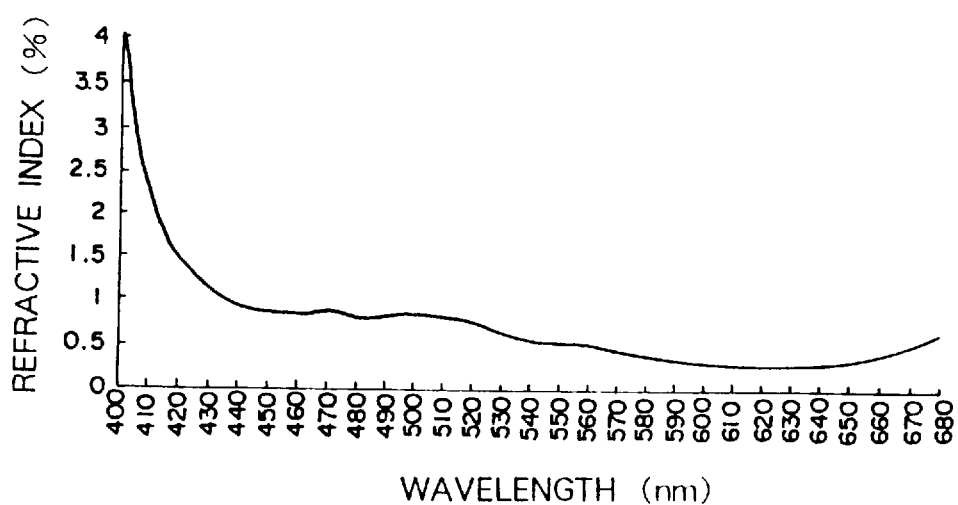
FIG. 3 is a view showing an example of the spectral reflectance of an anti-reflection film.

FIG. 3 is a view showing an example of the spectral reflectance of an anti-reflection film. As illustrated, it has an excellent anti-reflection effect.

The anti-pollution layer 14 formed on the outermost surface of the functional film 11 is resistant to adhesion of fingerprints and other dirt when touched directly by the hand and enables any dirt which does adhere to it to be easily removed by wiping by a dry or wet cloth etc. The anti-pollution layer 14 may be made of a material such as a thin layer of a silicone resin base with a perfluoro-group containing coating agent on it, an acrylic resin base with a perfluoro-group containing coating agent, etc.

The conductive layer 16 formed on the functional film 11 is connected to the ground by a conductive tape 13 adhered to a number of locations on the outer periphery of the functional film 11 shown in FIG. 1, the tension band 9, and the mounting flange 10 so as to allow the release of the charge in the tube to the ground and thereby give an anti-charge-up effect. The conductive tape 13 is not particularly limited, but for example use may be made of a metal foil tape.

Next, an explanation will be made of the reasons why grounding is necessary.

The fluorescent screen on the inside surface of the panel 1 shown in FIG. 1 has formed on it aluminum (Al) by vapor deposition or the funnel 2 is coated on its inside surface with a carbon layer so as to stabilize the potential of the inside wall of the cathode ray tube. If a high voltage is applied to the anode, the high voltage applied acts on the inside wall of the cathode ray tube so the surface of the panel 1 is charged positive by static induction. This static induction itself cannot be avoided, so to allow the charge to be released, the conductive layer 16 is interposed in the functional film 11 and the conductive layer 16 is connected to the ground electrodes through conductive tape 13. Note that a carbon layer is formed on the outer surface of the funnel 2 as well and this is connected to the ground electrodes.

One of the guidelines on prevention of charge-up at display tubes or other cathode ray tubes is the Swedish MPR-II standard. The MPR-II standard calls for the surface potential of the cathode ray tube to be within ±500V after 20 minutes after the power switch is turned on or off when measured in a constant temperature, dry environment of a room temperature of 21° C. to 22° C. and a relative humidity of 21 to 40 percent. To meet with this, it is necessary that the surface resistance be not more than about $10^{10}$ $\Omega/\square$.

Figure 6:
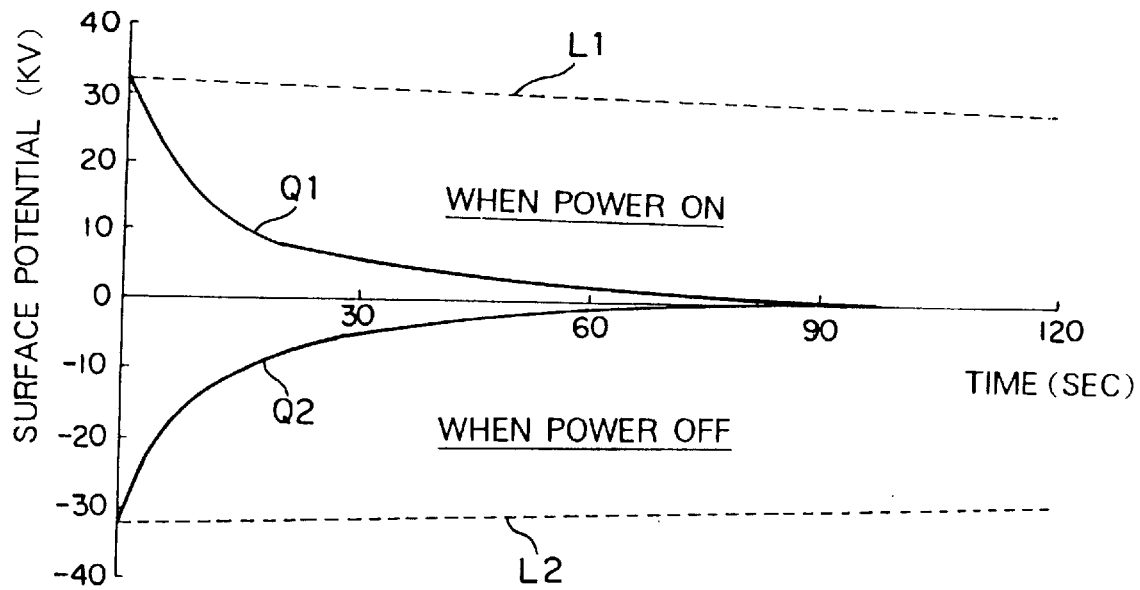
FIG. 6 is a graph of the anti-charge-up effect of the functional film.

FIG. 6 is a graph of the anti-charge-up effect of the functional film. That is, it is a graph for explaining the anti-charge-up function of the conductive layer 16 in a cathode ray tube to which the functional film 11 of the above embodiment is adhered. The curves Q1 and Q2 show the changes in the potential at the surface of a cathode ray tube when the power is on and off in the case of use of a 17-inch cathode ray tube with a surface resistance of $10^9$ $\Omega/\square$ between conductive tapes adhered to the two ends of a functional plastic film adhered to the surface of the cathode ray tube. Compared with the curves L1 and L2 of cathode ray tubes without anti-charge-up functions, the charge-up is greatly reduced in this embodiment.

On the other hand, the same standards (MPR-II) and guidelines (TCO) have been established on the AC fields which the deflection yokes and high voltage transformers may produce. One approach to meet with these standards is to lower the surface resistance of the display tube or other cathode ray tube.

Figure 7:
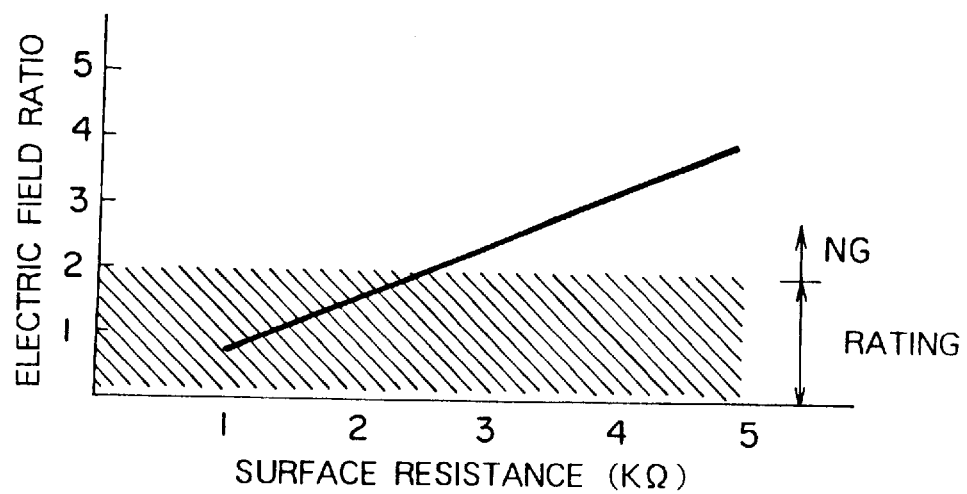
FIG. 7 is a graph of the relationship between the surface resistance and the leakage-electric-field intensity rate.

FIG. 7 is a graph of the relationship between the surface resistance and the leakage electric-field intensity rate. That is, it shows the relationship between the surface resistance of the conductive tape adhered to the electrode portions formed at the two ends of the functional film adhered to the surface of the panel of a cathode ray tube as a measure against electromagnetic waves leaking from the face of the cathode ray tube and the anti-electromagnetic wave effect.

As shown in FIG. 7, it was confirmed that in the case of a 17-inch display tube, if the surface resistance between conductive tapes adhered to the functional film attached to the panel surface is less than 2 k$\Omega$, the standards can be cleared with no problems.

It is possible to improve the surface resistance between conductive tapes 13 adhered to the two ends of the functional film 11 shown in FIG. 1 by removing the anti-reflection film 15 and anti-pollution layer 14 interposed between the conductive layer 16 shown in FIG. 2 and the conductive tape 13 shown in FIG. 1 or penetrating them by a conductive material to lower the resistance.

Figure 4:
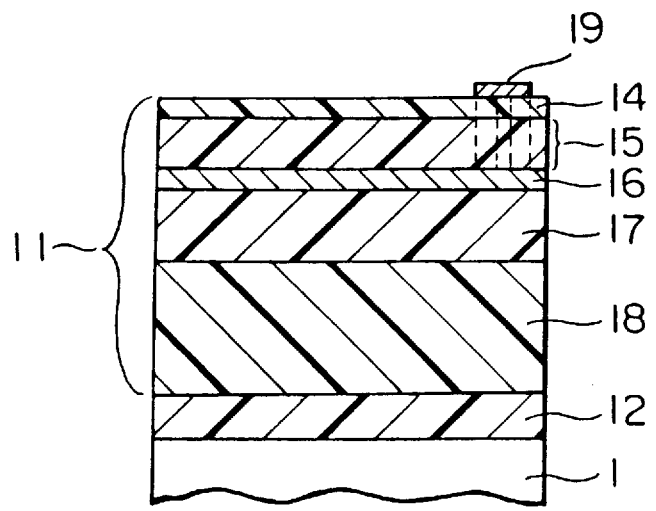
FIG. 4 is cross-sectional view key portions of the functional film on which are provided the ground electrodes.
Figure 5:
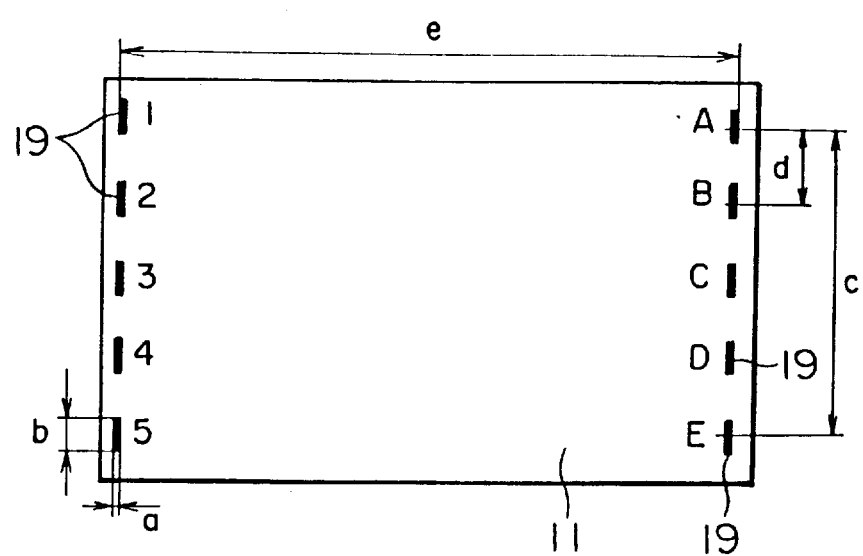
FIG. 5 is a view of the positions at which the ground electrodes are provided.

In the present embodiment, as shown in FIG. 4 and FIG. 5, on the anti-pollution layer 14 of the functional film 11 using PET or the like as the transparent plastic film substrate 18, ground electrodes 19 are formed at the regions outside of the effective screen by the ultrasonic solder used for welding glass or ceramics.

Table 1 shows the quality of the ground electrodes 19 formed under various conditions on functional films 11 using a PET material as a substrate using Cerasolza W123 (brandname of Asahi Glass, melting point of 123° C.) as the ultrasonic solder.

TABLE 1

Quality of Ground Electrodes

| Soldering rod temperature (°C.) | Output of ultrasonic wave generator (W) | | | | |
|---|---|---|---|---|---|
| | 2 | 4 | 6 | 8 | 10 |
| 140 | Poor | Poor | Poor | Poor | Poor |
| 170 | Poor | Poor | Poor | Poor | Poor |
| 195 | Good | Good | Good | Good | Good |
| 220 | Good | Good | Good | Good | Good |
| 250 | Poor | Poor | Poor | Poor | Poor |

The figures at the top of Table 1 show the output of the ultrasonic wave generator (W). The figures at the left column show the temperature of the soldering iron. From the results shown in Table 1, the solder does not melt at a soldering iron temperature of 140° C., while the solder will melt, but the adhesion with the surface of the functional film will be weak and peeling will easily occur at one of 170° C. With a soldering iron temperature of 195° to 220° C., it was found that the adhesion with the surface of the functional film 11 was strong regardless of the output of the ultrasonic wave generator (2 to 10 W). With a soldering iron temperature of 250° C., the functional film 11 deformed. Note that the deformation temperature of polyethylene terephthalate is 200° C. and the melting point is 263° C.

FIG. 5 is a view of the positions at which the ground electrodes are provided. It shows the electrodes 19 formed by Cerasolza W123 (brandname of Asahi Glass) solder at a soldering iron temperature of 200° C. and an ultrasonic wave generator output of 5 W. The electrodes 19a have widths a of 3 mm and lengths b of 9 mm. The distance e between the electrodes 19 at the two ends is 350 mm, the pitch d between electrodes at the ends is 55 mm, and the distance C from the position A (or the position 1) to the position E (or the position 5) is 220 mm. The thickness of the electrodes is not more than 0.1 mm.

Table 2 shows the results of actual measurements of the surface resistances between the electrodes 19 of the positions 1 to 5 and the electrodes of the positions A to E.

TABLE 2

Surface Resistances (Unit: k$\Omega$)

| | A | B | C | D | E |
|---|---|---|---|---|---|
| 1 | 1.0 | 1.0 | 0.8 | 1.0 | 1.0 |
| 2 | 0.8 | 0.8 | 0.7 | 0.8 | 0.8 |
| 3 | 1.0 | 1.0 | 0.8 | 1.0 | 1.0 |
| 4 | 1.0 | 1.0 | 0.8 | 1.0 | 0.8 |
| 5 | 1.4 | 1.2 | 1.0 | 1.2 | 1.2 |

Note that the functional film 11 with the electrodes 19 did not change in the adhesion of the electrodes 19 or the surface resistance between electrodes 19 after a heat cycle test of −40° C. to +70° C. of 26 hours. As shown in Table 2, it was confirmed that the surface resistance was less than 2 k$\Omega$. Accordingly, along with the results shown in FIG. 7, since the surface resistance is less than 2 k$\Omega$, it was confirmed that it was possible to clear without any problem the standards regarding prevention of electromagnetic waves. Further, it was confirmed that even if there is an anti-reflection film 15 or anti-pollution layer 14 etc. present between the electrodes 19 and the conductive layer 16 as shown in FIG. 4, these can be electrically connected with each other through the ultrasonic solder.

Next, the surface of the functional film 11 was cleaned by ultraviolet rays and ozone for the purpose of improving the wettability of the anti-pollution layer 14 with the ultrasonic solder.

The ultraviolet cleaning was performed using a low voltage mercury lamp producing ultraviolet rays of 184.9 nm and 253.7 nm to break down the dirt (organic matter) adhering to the surface of the functional plastic film and create an active surface on which the electrodes 19 were then formed by ultrasonic solder.

Table 3 shows the adhesion of the ultrasonic solder depending on the ultraviolet cleaning.

TABLE 3

Adhesion of Ultrasonic Solder

| Soldering iron temperature (°C.) | Ultraviolet cleaning (mJ/cm$^2$) | |
| --- | --- | --- |
| | 0 | 360 |
| 140 | Poor | Poor |
| 170 | Poor | Good |
| 195 | Good | Good |
| 220 | Good | Good |
| 250 | Poor | Poor |

With 250 mJ/cm$^2$ of irradiation of ultraviolet rays, it was confirmed that the wettability of the surface of the anti-pollution layer 14 with the solder is improved and it is possible to form electrodes 19 with strong adhesion even with a soldering iron temperature of 170° C.

Note that the specifications of the ultrasonic wave soldering power source used in the above embodiment were as follows:

Ultrasonic wave generation frequency: 60±5 kHz

Ultrasonic wave generator output

Rated: 15 W (maximum)

Actual: 10 W (maximum)

Next, an example of the method of manufacturing the cathode ray tube according to the above embodiment will is be explained.

As the panel 1 shown in FIG. 1, one which has not been polished on its outer surface is provided. A fluorescent screen 6 is prepared on the inside surface of the panel 1 and a shadow mask 5 attached, then the panel 4 is attached to the funnel glass 2 to produce the cathode ray tube with an implosion-protection band. Next, the surface of the panel 1 of the cathode ray tube is cleaned successively by a cleaning solution, pure water, and an alcohol based solvent, then dried.

The ultraviolet curing resin 12 may be coated by a known method, for example, the flow coating method, roll coating method, or bar coating method, after removing the air bubbles contained in the resin in advance before the coating.

Next, the ultraviolet curing resin 12 is coated on the surface of the panel 1. As this ultraviolet curing resin 12, use is made of one adjusted so that the refractive index of the cured film has a difference of less than 0.8 percent with the refractive index of the panel 1.

In this embodiment, the ultraviolet curing resin used is a composition of a molecular weight of at least 550 comprised of 10 percent by weight of bisphenol A type epoxymethacrylate, 20 percent by weight of urethane methacrylate, 70 percent by weight of monomethacrylate containing hydroxyl groups, 3 percent of a photopolymerization initiator, and several percent of additives.

Next, a pressurizing roll etc. was used to press the functional film 11 against the surface of the panel 1 to unify the thickness of the ultraviolet curing resin 12 and prevent creases or wrinkles from appearing on the surface. The thickness of the ultraviolet curing resin 12 is preferably 0.05 to 2.5 mm. As the pressurizing roll, use may be made of a metal roll, a hard rubber roll, a rubber lined metal roll, etc.

Next, ultraviolet rays are irradiated from above the functional film 11 by an irradiating source to cure the ultraviolet curing resin 12. As the irradiating source, use may be made of a metal halide lamp, a high voltage mercury lamp, a xenon lamp, etc. As the irradiated energy, 300 to 500 mJ/cm$^2$ is suitable.

Next, the ground electrodes 19 shown in FIGS. 4 and 5 are formed by ultrasonic solder at regions of the functional film 11 outside the effective screen. The number of the ground electrodes 19 formed and the intervals of formation are not particularly limited and are determined by the desired antistatic effect and anti-electromagnetic wave effect. The other conditions for the ultrasonic solder are the same as explained above. Further, as explained above, before the ultrasonic soldering, it is preferable to clean the surface of the functional film 11 by ultraviolet rays under the conditions explained above. This ultraviolet cleaning may be performed before or after adhering the functional film 11 to the panel.

Next, the conductive tape 13 is attached at several locations at the periphery of the functional film 11 corresponding to the ground electrodes 19 or wound around the same so as to establish conduction between the ground electrodes 19 and the tension band 9 and ground the conductive layer 16 shown in FIG. 4.

While the present invention has been described with preference to various aspects and embodiments, it is not limited to the same and includes all modifications within the scope of the claims.

For example, the anti-charge-up structure of the panel of the present invention and the method of manufacture of the same may be applied not only to cathode ray tubes, but to all display devices having such cathode ray tubes or display devices having panels on which images are projected.

As explained above, according to the present invention, it becomes possible to connect the ground electrodes and the conductive layer in the functional film just by forming the ground electrodes by ultrasonic soldering from above the functional film with the insulating layer on its surface. Accordingly, adhering a conductive tape to the ground electrodes enables grounding of the conductive layer and enables effective prevention of charge-up on the panel surface. Further, it is effective for measures against electromagnetic waves (ELF/VLF).

By cleaning the surface of the functional film by ultraviolet rays before forming the ground electrodes by ultrasonic soldering at the surface of the functional film, the wettability with the solder is improved and stronger connection of the ground electrodes at a lower soldering temperature becomes possible.

By using a functional film on whose surface has been formed an anti-pollution layer having perfluoro groups on the surface, the surface of the functional film becomes nonsticky and therefore resistant to adhesion of dust and becomes slippery and therefore easy to clean off, so the surface will not become dirty and even if becoming dirty will be easy to clean off so the quality of the image will be improved.

Compared with the method of adhering a glass sheet to the surface of the panel, the method of present invention enables any functional film whose surface has been found to be defective or damaged to be easily peeled off and another film to be adhered.

What is claimed is:

1. A cathode ray tube, comprising:

a front panel glass having a fluorescent screen;

a glass envelope sealed with the front panel;

a film having a conductive layer and an insulating layer superimposed on the outer side of the front panel glass;

a plurality of ground electrodes soldered on the film by using a soldering iron which has an ultrasonic wave generator, wherein the conductive layer is electrically connected with the ground electrodes through the insulating layer;

a plurality of conductive tapes respectively arranged on said plurality of ground electrodes.

2. A cathode ray tube as set forth in claim 1, wherein said film comprises an anti-pollution layer formed between said ground electrodes and said conductive layer.

3. A method of manufacturing a cathode ray tube having a front panel glass coated with a film, the method including:

cleaning the front panel glass;

providing an ultraviolet-curing resin composition on the front panel;

arranging a film having a conductive layer and an insulating layer on the ultraviolet-curing resin composition;

curing the ultraviolet-curing resin composition by irradiation with ultraviolet rays to join the front panel glass and the film into one unit;

soldering a plurality of ground electrodes on the film by using a soldering iron which has an ultrasonic wave generator, wherein the conductive layer is electrically connected with the ground electrodes through the insulating layer; and adhering a respective plurality of conductive tapes to the plurality of ground electrodes.

4. A method of manufacturing a cathode ray tube as set forth in claim 3, wherein said ultraviolet-curing resin composition has a refractive index which differs from the refractive index of said front panel glass by not more than 0.8 percent.

5. A method of manufacturing a cathode ray tube as set forth in claim 3, wherein said film comprises an anti-pollution layer formed between the ground electrodes and said conductive layer.

6. A method of manufacturing a cathode ray tube as set forth in claim 3, wherein the surface of said film is cleaned by irradiation with ultraviolet rays.

* * * * *